March 25, 1969 A. JENSEN 3,435,255

PULSE CONTROLLED SWITCH HAVING SOLID STATE SWITCHING ELEMENTS ISOLATED FROM TRANSIENT VOLTAGES

Filed March 9, 1965

United States Patent Office 3,435,255

Patented Mar. 25, 1969

3,435,255

PULSE CONTROLLED SWITCH HAVING SOLID STATE SWITCHING ELEMENTS ISOLATED FROM TRANSIENT VOLTAGES

Arne Jensen, Havnberg, Als, Denmark, assignor to Danfoss A/S, Nordborg, Denmark, a company of Denmark Filed Mar. 9, 1965, Ser. No. 438,255

Claims priority, application Germany, Mar. 19, 1964, D 43,927

Int. Cl. H03k *17/00, 3/26*

U.S. Cl. 307—258 4 Claims

ABSTRACT OF THE DISCLOSURE

An electrically controlled switch in which junctionless, non-rectifying, solid state semiconductor switching elements, having a symmetrical current-voltage characteristic, switch from a high resistance condition to a low resistance condition when a threshold value of a voltage thereacross is exceeded by pulses applied from a control pulse source to switch them to their low resistance condition in each half cycle of the voltage of an alternating current source applying current to a load through the switching elements. The switches are isolated from short time transient voltages from the circuit to which the switch is connected to avoid spurious switching.

The invention relates to an electrically controlled switch for a current carrying circuit, and more particularly to a switch using solid state elements.

Solid state switch elements which switch from a high resistance to a low resistance condition when a threshold value of an applied voltage is exceeded, have to be triggered, for example by a control apparatus, connected in parallel to the solid state switch element to provide the control voltage required for the switch to function.

A solid state switch of the above mentioned type must be connected in a circuit, the supply voltage of which is below the threshold value required for a switch function, as the switch would otherwise remain constantly in the low resistance condition. If, in order to obtain a higher voltage a control voltage is applied in series to the supply voltage, then the threshold value cannot be very much larger than the normal supply voltage because, otherwise it might cause damage in the circuit. If, however, the value of the supply voltage and the threshold is almost the same, then some transient or an impulse voltage, which is inevitable in a power supply, might cause the solid state switch to switch over at some unwanted time. The same situation pertains if the solid state switch is connected in parallel to the control apparatus which is providing the necessary control voltage for the switching function. This control voltage might also have some influence on the supply mains and might cause damage; thus it should not be chosen to be much larger than the mains voltage. This again means that the solid state switch may operate spuriously due to short excess voltage pulses from the mains. It is an object of the invention to provide for positive switching and to avoid the disadvantages mentioned.

Briefly, according to the invention, an inductance or choke is placed in series with the solid state switch to prevent any unwanted switching ON of the solid state switch, which might have been the result of some uncontrollable voltage pulses from the supply mains. At the same time the choke, to a wide extent, separates the control circuit from the rest of the circuit, especially if the control apparatus gives short pulses. Thus, a wider choice of threshold voltages and the control voltage is obtainable. No increase of the threshold value is needed to allow for transients from the mains. A rather high control voltage, in relation to the supply voltage, may, however, be used.

In many cases it is advantageous to additionally shunt the solid state switch with a capacitor or to use a low-pass filter to isolate unwanted transients in the mains from the solid state switch, and to simultaneously protect the mains against disturbances arising from switching transients due to operation of the solid state switch.

A particularly interesting device for use in connection with solid state switch elements useful in the invention is made from tellurium, with additives taken from Groups IV and V of the Periodic Table of Elements. The base substance is polycrystalline. These switches are absolutely symmetrical, have high current carrying capacity, and are easily manufactured. Their switching threshold potential can readily be changed by choice of the relative ratio of components, or by appropriate choice of the thickness of the body. As an example, a solid state switch may consist of approximately 67.5% tellurium, 25% arsenic, and 7.5% germanium, made by vapor deposition or evaporation on a metal plate, by sintering, or by solidification of an alloy melt. A pair, or more of such solid state switch elements can be arranged as a single unit having a common electrode. Each of the elements can be switched separately; yet a combined assembly is entirely possible, simplifying the connection to the common terminal or junction over that of several physically separate parts or elements.

The invention is also applicable for use with monocrystalline multi-layer diodes, for example five layer diodes.

The structure, organization and operation of the invention will now be described more specifically in the following detailed description with reference to the accompanying drawings, in which.

Figure 1:
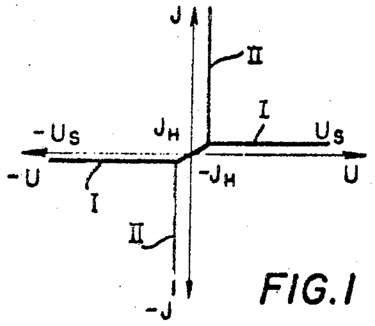
FIG. 1 is a typical voltage (abscissa) vs. current (ordinate) diagram for a solid state switching element for use in the switch according to the present invention.

FIG. 1 shows, diagrammatically, a current J through a symmetrical solid state switching element, having a voltage U applied thereacross. Below the threshold potential $\pm U_S$, the current is practically zero since the element is in its high resistance state, in which its resistance is up to several megohms (Curve I). As soon as the switching threshold potential $U_S$ is exceeded, the switching element changes to its low resistance state (Curve II), in which its resistance may be one ohm or less. The current through the switch is then essentially determined only by the resistance of the remainder of the circuit. The element remains in the low resistance state until the current therethrough decreases below the holding value $J_H$, which is almost at the zero point. As soon as $J_H$ is passed, the element changes back to its high resistance state.

Figure 2:
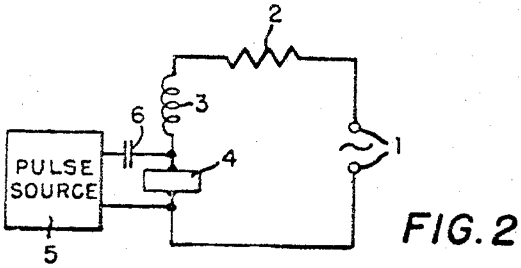
FIG. 2 is an embodiment of a switch according to the present invention.

The circuit in FIG. 2 consists of an alternating current supply 1, a load in the form of a resistor 2, a choke coil 3 and a solid state switch element 4. The threshold potential of switch element 4 is chosen to be larger than the voltage of supply 1, so that the circuit through load 2 is practically interrupted. A control apparatus 5 is connected in parallel with switch element 4, preferably over a capacitor 6. This control apparatus supplies an impulse of short duration, the amplitude of which is above the threshold value of the solid state switch 4 during each half cycle of the supply 1. Consequently the solid state switch is brought into the low resistance condition in each half cycle where it remains until almost the next zero or null point for the said half cycle is reached. A current is therefore flowing in the circuit of load 2.

Figure 3:
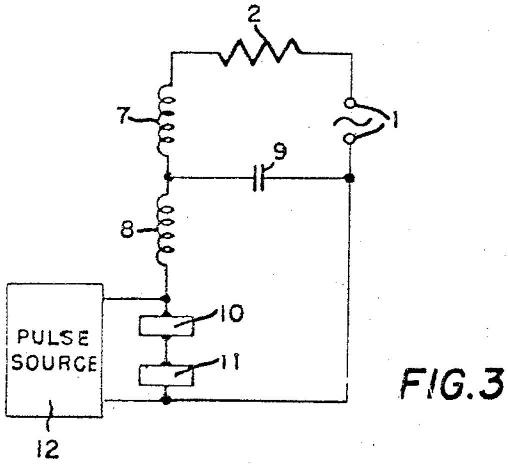
FIG. 3 is another embodiment of a switch according to the present invention.

In FIG. 3 the single choke 3 has been replaced by a low-pass filter, consisting of two choke coils 7 and 8 connected in series with the solid state switch and a capacitor 9, shunting the solid state switch. The solid state switch need not consist of a single element, but may be formed of several, e.g. two parts 10 and 11, which are both switched ON by means of a control apparatus 12.

The inductance 3 (FIG. 2) and the low-pass filter formed of the network 7, 8, and 9 (FIG. 3) isolate the solid state switch elements from short time transients which might cause spurious operation, and at the same time isolate the load circuit and the supply mains 1 from the sharp peaks from control pulse source 5, and 12, respectively, emitted by sources 5, 12, at the time when the solid state elements are to be switched.

Preferably, the control apparatus is connected to the mains supply circuit 1, to provide for synchronization of the control signals with the phase relationship of the supplying potential. The solid state switch may also be used for the switching ON of a D.C. load.

I claim:

1. Electrically controlled switch arrangement comprising at least on junctionless, non-rectifying, solid state semiconductor switching element which switches from a high resistance condition to a low resistance condition when a threshold value of the voltage applied thereacross is exceeded said solid state switching element having a symmetrical voltage circuit characteristic, a control apparatus connected across said switching element providing control voltage pulses for switching said element in each half cycle of an alternating current applied thereto a load in series with said switching element, an alternating current source of power in series with said load providing alternating current to said load under control of and through said switching element, two inductors in series connection with said solid state switching elements connected intermediate the load and said switching element to isolate the switching element from said power source to preclude transients from said power source having peak values close to said voltage pulses from switching said switching element, and a capacitor connected to said source in parallel with said load and to a junction between said inductors.

2. In an electrical circuit, a pulse controlled switch, said switch comprising at least one junctionless, non-rectifying solid state semiconductor switching element which switches from a high resistance condition to a low resistance condition when a threshold value of a voltage applied theracross is exceeded, said threshold value being above the nominal voltage of the circuit; said solid state switching element having a symmetrical voltage-current characteristic, a pulse source connected across said switching element to supply pulses to said element, said pulse source emitting sharp pulses of a potential in excess of said threshold value and thus in excess of the nominal voltage of the circuit to switch said element at each half cycle of on an alternating current applied thereto, a load in series with said switching element, an alternating current source in series with said load to supply alternating current to said load under control of and through said switching element, two inductors in said circuit and in series with said element connected intermediate the load and said switching element to isolate the switching element from said power source to preclude transients from said power source having peak values close to said voltage pulses from switching said switching element, and a capacitor connected to said source in parallel with said load and to a junction between said inductors.

3. Switch arrangement as claimed in claim 2 in which said inductors and capacitor are relatively dimensioned to form a low-pass filter.

4. Switch arrangement as claimed in claim 3, including connections connecting said control apparatus to said switching element and said inductors for supplying pulses of a duration so short that said low-pass filter blocks said pulses.

References Cited

UNITED STATES PATENTS

| | | | |
|---|---|---|---|
| 3,188,487 | 6/1965 | Hutson | 307—88.5 |
| 3,271,591 | 9/1966 | Ovshinsky | 307—88.5 |

ARTHUR GAUSS, *Primary Examiner.*

D. D. FORRER, *Assistant Examiner.*

U.S. Cl. X.R.

307—324